(12) United States Patent
Mermoz et al.

(10) Patent No.: US 9,586,207 B2
(45) Date of Patent: Mar. 7, 2017

(54) ETCHING METHOD FOR FORMING A CARRIER HAVING INWARD SIDE WALLS IN PARTICULAR FOR CONFINING A DROPLET FOR CAPILLARY SELF-ASSEMBLY

(71) Applicants: COMMISSARIAT A L'ENERGIE ATOMIQUE ET AUX ENERGIES ALTERNATIVES, Paris (FR); STMICROELECTRONICS (CROLLES 2) SAS, Crolles (FR)

(72) Inventors: Sebastien Mermoz, Meylan (FR); Lea Di Cioccio, Saint Ismier (FR); Thomas Magis, Grenoble (FR); Loic Sanchez, Voiron (FR)

(73) Assignees: Commissariat à l'énergie atomique et aux énergies alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/903,960

(22) PCT Filed: Jul. 8, 2014

(86) PCT No.: PCT/EP2014/064518
§ 371 (c)(1),
(2) Date: Jan. 8, 2016

(87) PCT Pub. No.: WO2015/004096
PCT Pub. Date: Jan. 15, 2015

(65) Prior Publication Data
US 2016/0144365 A1    May 26, 2016

(30) Foreign Application Priority Data

Jul. 9, 2013  (FR) ...................... 13 56719

(51) Int. Cl.
*B44C 1/22* (2006.01)
*C03C 15/00* (2006.01)
(Continued)

(52) U.S. Cl.
CPC .............. *B01L 3/561* (2013.01); *B01L 3/502* (2013.01); *B81B 1/002* (2013.01);
(Continued)

(58) Field of Classification Search
CPC ...................................................... B01L 3/561
(Continued)

(56) References Cited

U.S. PATENT DOCUMENTS

| 5,501,893 A | 3/1996 | Laermer et al. |
| 2003/0189024 A1 | 10/2003 | Khan et al. |
| 2011/0207323 A1 | 8/2011 | Ditizio |

OTHER PUBLICATIONS

International Search Report Issued Sep. 3, 2014, in PCT/EP2014/064518 Filed Jul. 8, 2014.
(Continued)

*Primary Examiner* — Roberts Culbert
(74) *Attorney, Agent, or Firm* — Oblon, McClelland, Maier & Neustadt, L.L.P.

(57) ABSTRACT

A method for capillary self-assembly of a plate and a carrier, including: forming an etching mask on a region of a substrate; reactive-ion etching the substrate, the etching using a series of cycles each including isotropic etching followed by surface passivation, wherein a duration of the isotropic etching for each cycle increases from one cycle to another, a ratio between durations of the passivation and etching of each cycle is lower than a ratio for carrying out a vertical anisotropic etching to form a carrier having an upper surface defined by the region and side walls defining an acute angle (Continued)

with the upper surface; removing the etching mask; placing a droplet on the upper surface of the carrier; and placing the plate on the droplet.

6 Claims, 3 Drawing Sheets

(51) Int. Cl.
  *C03C 25/68*    (2006.01)
  *C23F 1/00*     (2006.01)
  *B01L 3/00*     (2006.01)
  *B81C 1/00*     (2006.01)
  *B81C 3/00*     (2006.01)
  *B81B 1/00*     (2006.01)
  *H01L 23/13*     (2006.01)
  *H01L 21/3065*    (2006.01)

(52) U.S. Cl.
  CPC ...... *B81C 1/00555* (2013.01); *B81C 1/00626* (2013.01); *B81C 3/005* (2013.01); *B01L 2200/12* (2013.01); *B01L 2300/0838* (2013.01); *B81B 2201/058* (2013.01); *B81C 2201/0112* (2013.01); *H01L 21/30655* (2013.01); *H01L 23/13* (2013.01); *H01L 2224/95146* (2013.01)

(58) Field of Classification Search
  USPC ...................................................... 216/2, 67
  See application file for complete search history.

(56) References Cited

OTHER PUBLICATIONS

French Preliminary Search Report Issued Jun. 17, 2014, in FR 13 56719 Filed Jul. 9, 2013.
De Boer, et al., "Guidelines for Etching Silicon MEMS Structures Using Fluorine High-Density Plasmas at Cryogenic Temperatures," Journal of Microelectromechanical Systems, IEEE Service Center, US, vol. 11, No. 4, pp. 385-401, Aug. 1, 2002, XP011064772.
Srinivasan, et al., "Microstructure to Substrate Self-Assembly Using Capillary Forces," Journal of Microelectromechanical Systems, IEEE Service Center, US, vol. 10, No. 1, pp. 17-24, Mar. 1, 2001, XP011034623.

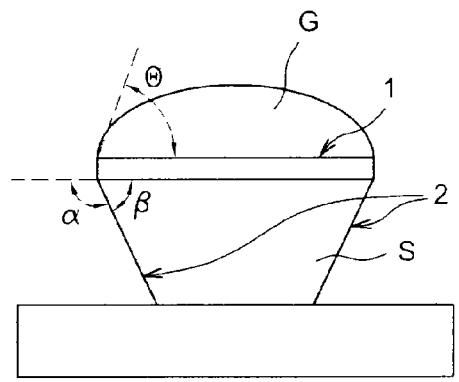
FIG. 1
FIG. 2a
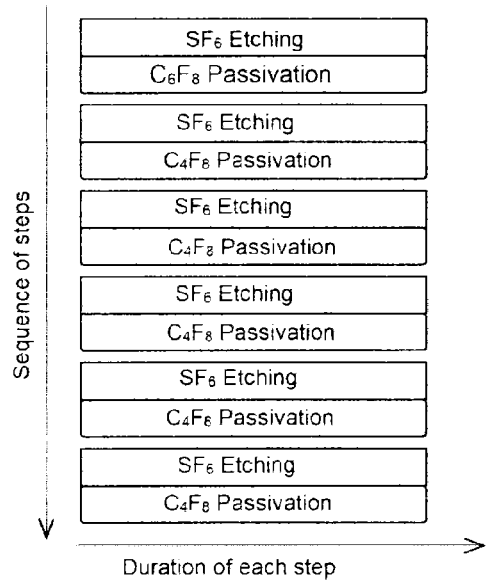
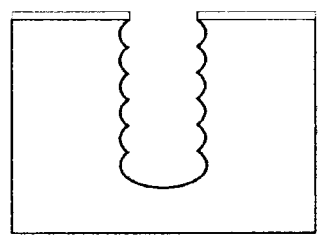
FIG. 2b

ETCHING METHOD FOR FORMING A CARRIER HAVING INWARD SIDE WALLS IN PARTICULAR FOR CONFINING A DROPLET FOR CAPILLARY SELF-ASSEMBLY

TECHNICAL FIELD

The field of the invention relates to the creation of structures by structure capillary self-assembly. The main applications of this technique are 3D microelectronics (for which we are looking to vertically stack, then seal, electronic microchips), optics (in particular the alignment of electroluminescent diodes or micro-mirrors), and finally the packaging of microelectromechanical systems (MEMS) or microfluidic systems (for which we are looking to accurately position a cover plate in order to fix it onto the system).

PRIOR ART

The capillary self-assembly technique for mesoscopic objects is based on the use of capillary forces to move an object in a predefined alignment. According to this technique, a mobile plate (or a microchip or pad) of any shape is placed on a liquid droplet previously placed on a fixed carrier having a matching shape. The capillary forces created by the anchoring of the liquid on the edges of the mobile plate and of the carrier are used to align the mobile plate exactly above the carrier. The envelope of the floating mobile plate is therefore the exact image of the carrier envelope, vertically translated upwards.

In the case where the liquid is water, evaporation results in contact between the plate and the carrier, which become fixed together by direct bonding. This is the case of 3D microelectronics or of MEMS packaging, as well as of labs-on-a-chip.

In the case where the liquid is a chemical body that solidifies, the plate is attached in a highly-controlled location. This is in particular the case for optics.

In order to obtain a high alignment success rate, a maximum containment must be obtained for the fluid present at the plate/carrier interface. Two methods can be used to achieve this.

According to a first method, the containment is obtained topologically by means of a contrast based on the use of an embossment. The containment results from the attachment effect generally observed when the fluid spreads as far as the edge of a structure. According to this phenomenon, known as "canthotaxis" or "pinning", a droplet remains attached to the edge of the structure as long as the contact angle is between the natural contact angle $\theta$ and the value $\theta+\alpha$, where $\alpha$ represents the angle between the two portions of the solid. It is therefore advantageous to obtain the most "acute" angles possible so as to extend this angular interval.

According to a second method, the containment is obtained by means of a chemical contrast between two areas. The two areas having different affinities (hydrophilic/hydrophobic) with the fluid (water), the latter will preferably be located in the area with which it has the most affinity, i.e. the hydrophilic area. This is referred to as the wettability contrast. The higher this contrast, i.e. the greater the difference in the contact angle between the two surfaces, the more effective the containment.

Capillarity-assisted and direct bonding self-assembly of the plate and the carrier takes place without any intermediary layer (such as an alloy for thermocompression, a glue or a polymer for temporary bonding) and is solely based on the pre-treatment of the surfaces to be assembled to make them the most hydrophilic possible. The performance of such a pre-treatment process on structures having a wettability contrast nonetheless has the effect of making containment by chemical contrast obsolete. This therefore requires the topological containment to be as effective as possible.

DESCRIPTION OF THE INVENTION

The purpose of the invention is to improve the containment of the fluid present at the plate/carrier interface in order to achieve a high success rate during self-assembly. It in particular aims at providing an etching method for producing patterns having inward side walls with an angle at the edge of the pattern as acute as possible, in particular an angle of less than 70°.

It thus relates to a method for the capillary self-assembly of a plate and a carrier, which includes:
  forming an etching mask on a region of a substrate;
  the reactive-ion etching of the substrate, said etching comprising a series of cycles each including a step of isotropic etching followed by a step of surface passivation, wherein the duration of the isotropic etching step for each cycle increases from one cycle to another, the ratio between the durations of the passivation and isotropic etching steps of each cycle is lower than a ratio for carrying out a vertical anisotropic etching in order to form a carrier having an upper surface defined by said region and side walls defining an acute angle with said upper surface;
  removing the etching mask;
  placing a droplet on the upper surface of the carrier;
  placing the plate on the droplet.

By increasing from one cycle to another the duration of the etching step of each cycle, and by maintaining the ratio between the durations of the passivation and etching steps of each cycle at less than a ratio enabling a vertical anisotropic etching to take place, a lateral etching is promoted and is increasingly large as the etching progresses, which produces a carrier with side walls forming an acute angle with the upper surface, in particular an angle of less than 70°.

Some preferred, however non-limiting aspects of the method are as follows:
  the duration of the isotropic etching step increases from 10% to 40% from one cycle to another;
  the ratio between the durations of the passivation and etching steps of each cycle is reduced from one cycle to another.
  the ratio between the durations of the passivation and etching steps is maintained constant from one cycle to another.
  the acute angle is less than 70°.

According to another aspect, the invention relates to a reactive-ion etching method of a substrate to form a cavity having etching side walls forming an acute angle with the surface of the substrate, comprising a series of cycles, each including an isotropic etching step followed by a surface passivation step, characterised by the increase from one cycle to another in the duration of the isotropic etching step of each cycle, the ratio between the durations of the passivation and isotropic etching steps of each cycle being less than a ratio enabling a vertical anisotropic etching to take place.

The invention also relates to a droplet carrier for capillary self-assembly with a plate, including an upper surface on which a droplet is intended to be placed, and side walls for containing the droplet forming an acute angle with the upper surface, preferably an angle of less than 70°.

BRIEF DESCRIPTION OF THE FIGURES

Other aspects, purposes, advantages and characteristics of the invention shall be better understood upon reading the following detailed description given of non-limiting preferred embodiments of the invention, provided for illustration purposes, with reference to the appended figures, in which:

FIG. 1 illustrates a droplet carrier according to the invention;

FIGS. 2a and 2b illustrate a conventional etching method with a ratio between the durations of the etching and passivation steps resulting in vertical anisotropic etching;

DETAILED DESCRIPTION OF THE SPECIFIC EMBODIMENTS

Figure 3A:
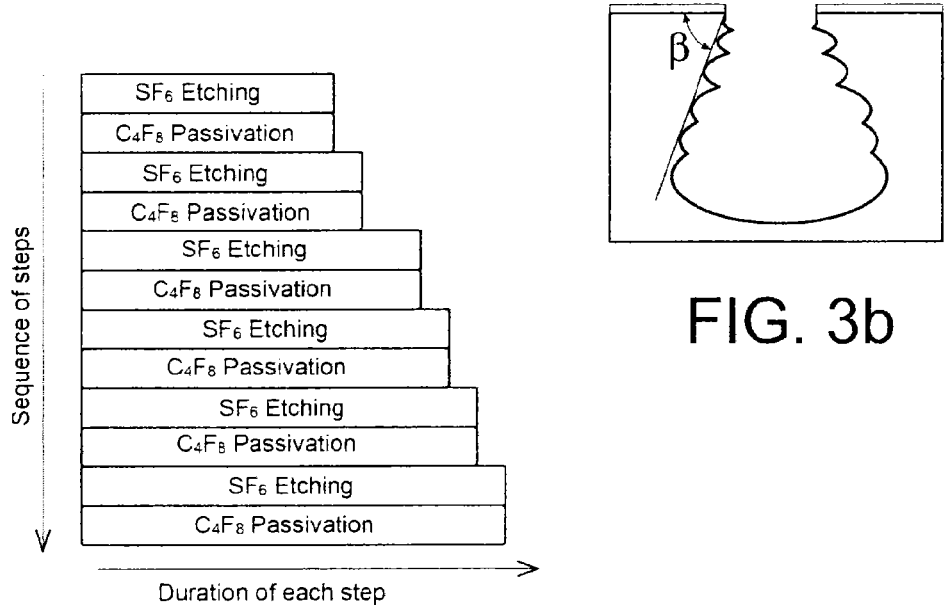
FIGS. 3a and 3b illustrate an etching according to one embodiment of the invention with a constant ratio between the duration of the passivation and etching steps.

According to a first aspect, the invention relates to a method for the capillary self-assembly of a plate and a carrier, which includes:
   forming an etching mask on a region of a substrate, for example a silicon or glass substrate, or a substrate with metal layers;
   the reactive-ion etching of the substrate in order to form the carrier, the latter having an upper surface defined by said region and side walls defining an acute angle with the upper surface;
   removing the etching mask;
   placing a droplet on the upper surface of the carrier;
   placing the plate on the droplet.

According to the second aspect, it relates to the reactive-ion etching method designed to form said carrier, as well as to said carrier for the capillary self-assembly of a plate.

The etching mask is, for example, a resin mask derived from a photoresist applied on the substrate, then exposed to light exposure with a masking adapted such that the photoresist covers said region of the substrate.

The etching mask can be removed using a solvent or by plasma pre-treatment, or even by cleaning, and thus exposes the upper surface of the carrier.

The droplet can be placed by droplet deposition or by full wetting of the substrate.

As stipulated hereinabove, the greater the angle α at the edge of the structure, the higher the topological containment effect. We are therefore looking to produce a carrier S having the profile with inward side walls shown in FIG. 1, comprising an upper surface 1 designed to receive a droplet G and side walls 2 forming an acute angle β with the upper surface.

Conventional etching methods such as plasma-based dry etching (reactive-ion etching or RIE) do not enable angles β of less than 85° to be obtained. This also applies for wet etching, which tends to produce profiles with outward side walls.

The effectiveness of the topological containment is therefore currently limited, which thus limits the success rate of the plate/carrier alignment, in particular within the scope of capillary self-assembly via direct bonding.

In order to overcome this restriction and obtain a pattern with inward side walls, the invention proposes using reactive-ion etching based on carrying out alternating isotropic etching steps and passivation steps.

Such an alternation between the etching step and the passivation step is known, in particular via the Bosch method, a description of which can be found in the document U.S. Pat. No. 5,501,893 A1, for producing deep etchings (>5 μm), with right-angled etching profiles) (90°). However, this alternation has the disadvantage of generating periodic roughness (referred to as "scalloping") on the etching flanges.

The majority of developments on deep etching aim at minimising this scalloping effect in order to make the flanges as stiff and as smooth as possible and therefore to overcome the residual scalloping effect. Conversely, this invention is based on using this scalloping effect and, in a general manner, rather than looking to minimise this effect, proposes maximising it and controlling its position in order to control the etching profile.

A Bosch-type etching method is classically performed by conducting a series of cycles, each having an isotropic etching step (typically $SF_6$ etching in the case of a silicon substrate), followed by a surface passivation step (typically by $C_4F_8$ plasma, still in the case of a silicon substrate, resulting in the deposition of a fluorocarbon layer). The etching steps are identical from one cycle to another. This also applies to the passivation steps. By adopting a ratio between the duration of a passivation step and the duration of an adequate etching step (such that the lateral etching is prevented by the passivation layer in each cycle), these durations also being constant from one cycle to another, a vertical anisotropic etching can eventually be produced.

This ratio, such that an etching cycle produces a vertical anisotropic etching, can in particular be equal to 1. FIG. 2a illustrates such a scenario, whereas FIG. 2b represents the cavity with right-angled side walls thus obtained. This ratio is more typically ½, whereby the duration of each etching step is 10 seconds and that of each passivation step is 5 seconds.

The invention proposes increasing from one cycle to another the duration of the etching step of each cycle, for example from 10 to 40% between each cycle (for example 30% between each cycle bringing the duration from 2 seconds to more than 20 seconds in 10 cycles), and maintaining the ratio between the durations of the passivation and etching steps of each cycle at less than the ratio enabling a vertical anisotropic etching to take place. Only the duration of the etching steps and, potentially, of the passivation steps is modified; the remaining parameters (source power, field power, pressure, etc.) of the DRIE etching (Deep RIE) remain identical.

Therefore, an increasingly large lateral etching is promoted as the etching cycles progress. This produces a carrier with side walls (the etching flanks) that form an acute angle with the upper surface (region of the substrate under the mask), in particular an angle of less than 70°.

Figure 3B:
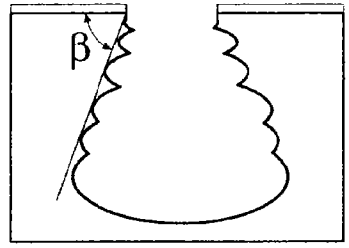

In one embodiment, the ratio between the durations of the passivation and etching steps is maintained constant from one cycle (and less than the ratio enabling a vertical anisotropic etching to take place) to another, as illustrated in FIG. 3a. The increased duration of the etching and passivation steps results in the formation of a cavity, the side walls (etching flanks) of which form an acute angle with the surface of the substrate, in particular an angle β between 65° and 70° (see FIG. 3b).

In an example embodiment, the reactive-ion etching method according to the invention can include 5 to 10 isotropic etching/passivation cycles, with, for example, an etching speed of around 50 nm/sec and a passivation deposition speed of around 4.1 nm/sec, an initial etching duration of 5 seconds, an initial passivation duration of 12 seconds and an increase in said durations of 12% at each cycle.

Figure 5:
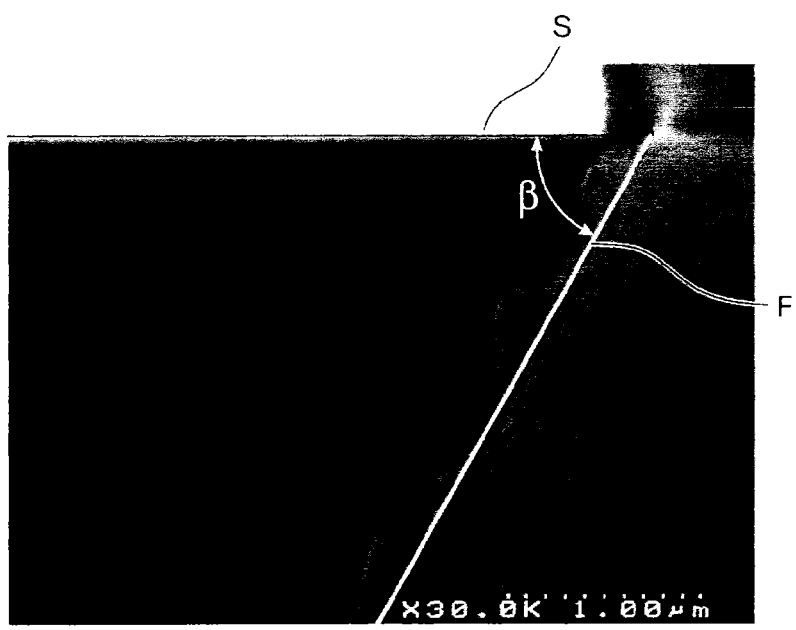
FIG. 5 is an image of an etching side walls with an acute angle obtained by implementing an etching method according to the invention.

FIG. 5 shows one example of a cavity obtained by etching according to this embodiment, producing an acute angle of around 65°.

This figure illustrates the presence of residual roughness from "scalloping" on the etching flanges. The acute angle β is measured between the plane S of the upper surface of the substrate and the plane of the etching side wall F, passing through the hollow of said roughness.

Figure 4A:
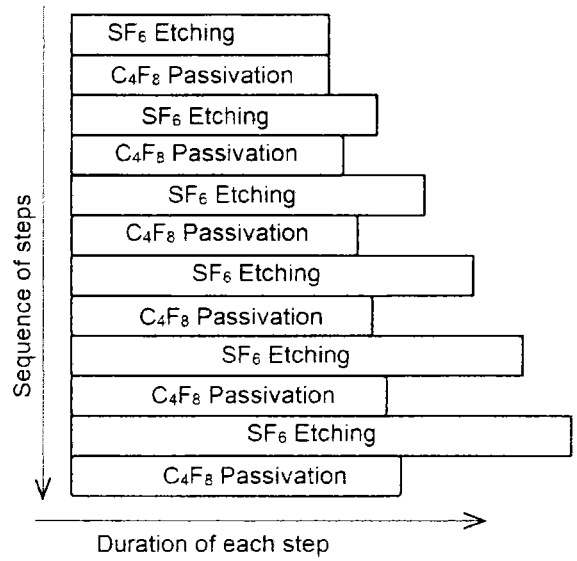
FIGS. 4a and 4b illustrate an etching according to another embodiment of the invention with a decreasing ratio between the duration of the passivation and etching steps.
Figure 4B:
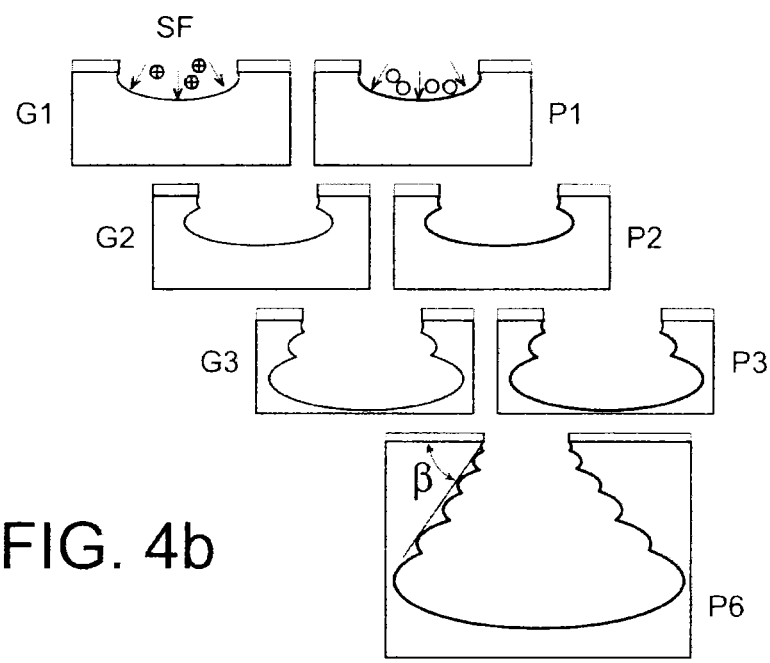

In another embodiment, the ratio between the durations of the passivation and etching steps of each cycle is reduced from one cycle to another. The duration of the passivation step of a cycle is thus maintained constant from one cycle to another, or is increased to a lesser degree than the duration of the etching step, as shown in FIG. 4a. FIG. 4b illustrates the cavity at different stages in the etching method: after the first, second and third isotropic etchings G1-G3, after the first, second, third and sixth passivations P1-P3, P6.

This embodiment promotes lateral etching even further, and results in the formation of a cavity, the walls of which form an acute angle β with the surface that is even lower, and thus in the formation of a carrier, in particular for droplet containment for capillary self-assembly with even more inward side walls, in particular an angle β between 45° and 50°.

The invention claimed is:

1. A method for the capillary self-assembly of a plate and a carrier, comprising:
    forming an etching mask on a region of a substrate;
    reactive-ion etching the substrate, the reactive-ion etching comprising a series of cycles each including an isotropic etching followed by a surface passivation, wherein a duration of the isotropic etching for each cycle increases from one cycle to another, a ratio between durations of the surface passivation and isotropic etching of each cycle is lower than a ratio for carrying out a vertical anisotropic etching, to form a carrier having an upper surface defined by the region and side walls forming an acute angle with the upper surface;
    removing the etching mask;
    placing a droplet on the upper surface of the carrier; and
    placing the plate on the droplet.

2. A method according to claim 1, wherein the duration of the isotropic etching increases from 10% to 40% from one cycle to another.

3. A method according to claim 1, wherein the ratio between the durations of the passivation and etching of each cycle is reduced from one cycle to another.

4. A method according to claim 1, wherein the ratio between the durations of the passivation and etching is maintained constant from one cycle to another.

5. A method according to claim 1, wherein the acute angle is less than 70°.

6. A reactive-ion etching method of etching a substrate to form a cavity having etching side walls forming an acute angle with a surface of the substrate, comprising:
    a series of cycles, each cycle including an isotropic etching followed by a surface passivation;
    wherein a duration of the isotropic etching of each cycle is progressively increased from one cycle to another; and
    wherein a ratio between durations of the passivation and isotropic etching of each cycle is less than a ratio enabling a vertical anisotropic etching to take place.

* * * * *